(12) United States Patent
Smith et al.

(10) Patent No.: US 7,825,706 B2
(45) Date of Patent: Nov. 2, 2010

(54) PHASE LOCKED LOOP THAT SETS GAIN AUTOMATICALLY

(75) Inventors: Alan Andrew Smith, Farnborough (GB); Julie Stuart, legal representative, Longfield (GB); Mark V. Harris, Farnborough (GB)

(73) Assignee: QUALCOMM Incorporated, San Diego, CA (US)

( * ) Notice: Subject to any disclaimer, the term of this patent is extended or adjusted under 35 U.S.C. 154(b) by 627 days.

(21) Appl. No.: 10/546,579

(22) PCT Filed: Dec. 13, 2004

(86) PCT No.: PCT/US2004/042040

§ 371 (c)(1),
(2), (4) Date: Aug. 22, 2005

(87) PCT Pub. No.: WO2005/060103

PCT Pub. Date: Jun. 30, 2005

(65) Prior Publication Data

US 2006/0197562 A1    Sep. 7, 2006

(51) Int. Cl.
 *H03L 7/06*        (2006.01)
(52) U.S. Cl. ...................................... 327/156
(58) Field of Classification Search .................. 327/147, 327/156
See application file for complete search history.

(56) References Cited

U.S. PATENT DOCUMENTS

| | | | |
|---|---|---|---|
| 3,750,035 A | 7/1973 | Crow | |
| 3,783,394 A | 1/1974 | Avery | |
| 4,207,539 A | 6/1980 | Minakuchi | |
| 4,394,778 A | 7/1983 | Ikeguchi et al. | |
| 4,562,410 A | 12/1985 | O'Rourke et al. | |
| 5,200,712 A | 4/1993 | Srivastava | |
| 5,317,285 A | 5/1994 | Chan | |
| 5,382,922 A | 1/1995 | Gersbach et al. | |
| 5,410,571 A | 4/1995 | Yonekawa et al. | |
| 5,461,344 A | 10/1995 | Andoh | |
| 5,487,093 A | 1/1996 | Adresen | |
| 5,678,200 A | 10/1997 | Levi | |
| 5,777,520 A * | 7/1998 | Kawakami | 331/1 R |

(Continued)

FOREIGN PATENT DOCUMENTS

EP    0028100    5/1981

(Continued)

OTHER PUBLICATIONS

Patent Abstracts of Japan vol. 006, No. 243 (E-145), Dec. 2, 1982 & JP57141137 A (Fujitsu KK), Sep. 1, 1982 *abstract*.

(Continued)

*Primary Examiner*—Quan Tra
(74) *Attorney, Agent, or Firm*—Jiayu Xu (57) ABSTRACT

There is provided a phase locked loop, PLL, that sets gain automatically. The PLL comprises a frequency discriminator for providing a first signal that represents the difference between a first frequency and a second frequency. The PLL also comprises a comparator coupled to the frequency discriminator for receiving the first signal and providing a second signal based on information from the first signal. The second signal is representative of a gain setting for the phase locked loop to set.

21 Claims, 4 Drawing Sheets

U.S. PATENT DOCUMENTS

| | | | |
|---|---|---|---|
| 5,973,572 A | 10/1999 | Ukita | |
| 6,018,556 A | 1/2000 | Janesch | |
| 6,114,888 A * | 9/2000 | Walley | 327/157 |
| 6,141,163 A * | 10/2000 | Nakamura et al. | 360/51 |
| 6,188,289 B1 | 2/2001 | Hyeon | |
| 6,249,189 B1 | 6/2001 | Wu | |
| 6,329,847 B1 | 12/2001 | Chabas | |
| 6,366,146 B2 * | 4/2002 | Fredriksson | 327/156 |
| 6,496,556 B1 | 12/2002 | Huehne et al. | |
| 6,531,926 B1 * | 3/2003 | Pate et al. | 331/17 |
| 6,552,618 B2 | 4/2003 | Nelson | |
| 6,624,707 B1 | 9/2003 | Davis et al. | |
| 6,965,271 B2 | 11/2005 | Smith et al. | |
| 7,042,253 B2 * | 5/2006 | Su et al. | 327/17 |
| 2001/0007436 A1 * | 7/2001 | Dosho et al. | 331/11 |
| 2002/0159351 A1 | 10/2002 | Tateishi | |

FOREIGN PATENT DOCUMENTS

| | | |
|---|---|---|
| EP | 0 500 014 | 8/1992 |
| EP | 0575713 A1 | 12/1993 |
| EP | 0732830 | 9/1996 |
| EP | 1184987 | 3/2002 |
| JP | 57-072430 | 5/1982 |
| JP | 57-141137 | 9/1982 |
| JP | 60-125021 | 7/1985 |
| JP | 61-245628 A | 10/1986 |
| JP | 01-241920 A | 9/1989 |
| JP | 04-240921 | 8/1992 |
| JP | H04-240921 | 8/1992 |
| JP | 2005-236431 A | 9/2005 |
| WO | 8600768 A1 | 1/1986 |
| WO | 96/29785 | 9/1996 |
| WO | 03/052936 | 6/2003 |
| WO | 2004/004126 | 1/2004 |
| WO | 2005060103 | 6/2005 |

OTHER PUBLICATIONS

Patent Abstracts of Japan vol. 009, No. 284 (E-357), Nov. 12, 1985 & JP60125021 A (Matsushita Denki Sangyo KK), Jul. 4, 1985 *abstract*.
Supplementary European Search Report—EP8000503, European Patent Office—Munich—Mar. 5, 2008.
International Search Report—EPO/EP04/814246—International Search Authority—Munich Jun. 27, 2007.
International Search Report—PCT/USO4/042040—International Search Authority—European Patent Office, Aug. 26, 2005.
Yeager, R. "Loop Gain Compensation in Phase-Locked Loops" RCA Review, RCA Corp. Princeton, US, vol. 47, Mar. 1, 1986, pp. 78-87.
Written Opinion—PCT/US04/042040—International Search Authority—Munich—Aug. 26, 2005.
International—Preliminary Report on Patentability—PCT/US04/042040—International Bureau of WIPO, Geneva—Jun. 12, 2006.

* cited by examiner

Look Up Table Implementation

FIG. 5

PHASE LOCKED LOOP THAT SETS GAIN AUTOMATICALLY

BACKGROUND

The invention relates to a phase-locked loop. More specifically, the invention relates to a phase-locked loop that sets gain automatically.

Mobile telephones and other communication transceivers generally comprise separate transmit and receive circuits that share a single frequency-synthesizer. The frequency-synthesizer serves as a local oscillator for both the transmit and receive circuits of the transceiver. These frequency-synthesizers typically comprise a phase-locked loop (PLL) that can be controlled to oscillate at specific frequencies. When the telephone is receiving signals the PLL will be controlled to oscillate at a receiving frequency and when the telephone is transmitting the PLL will be controlled to oscillate at a transmitting frequency.

Many modern mobile telephones are designed to operate in plural different cellular systems owned by different operators and operated under different communications standards. This usually means that the telephone's receiver must be able to receive signals at widely different frequencies and to switch quickly between those frequencies. The same is also true of the transmitter.

When the receiver (or transmitter) changes from one frequency to another, there is a period of time when the local oscillator is not locked onto a frequency. No communication is possible during this period of time and the mobile phone has to wait for the local oscillator to lock onto a frequency before over the air communications can resume.

If the local oscillator remains unlocked on a frequency for too long operation of the telephone could be interrupted. At the very least this will result in degradation in the user's perception of the quality of service. At worst it could result in a termination of the communication. It is therefore desirable to minimize the time the oscillator remains unlocked. One way of minimizing that time is to decrease the time taken for the PLL to change between different frequencies.

The overall gain of a PLL is a factor that affects the rate at which the PLL can change from one operating frequency to another. A PLL with a high gain will change more quickly between frequencies than a PLL with a lower gain. A PLL with lower gain is more stable once locked onto the desired frequency. However, when using a lower gain PLL for large frequency changes a condition known as cycle skip can occur. Cycle skip occurs when the phase error increases and exceeds 360 degrees. At the point where the phase error exceeds 360 degrees there is a sharp transition. When a PLL encounters this sharp transition it greatly lengthens the time it takes for a PLL to return to less than 360 degrees of error and lock onto a new frequency. A higher gain PLL generally will tolerate larger frequency changes without cycle skip occurring.

To take advantage of the benefits of both high and low gain in a PLL, current systems tend to utilise PLLs with selectable gains. Commercially available PLLs generally offer a choice of gain values programmable for the phase detector. By adjusting the gain of the phase detector the overall gain of the PLL can be adjusted. A low gain is selected when the PLL is locked onto a frequency and a high gain is selected during changes from one frequency to another.

Current techniques that use different phase detector gains involve programming the phase detector for each gain change. For example, a PLL is programmed to an initial or first frequency. While locked onto this first frequency the phase detector is at low gain. When a change in frequency is initiated, the PLL is programmed to a second frequency; and, the phase detector is simultaneously programmed to high gain. As the PLL approaches the second frequency, the phase detector is then re-programmed to low gain. Alternately, the phase detector could be re-programmed to reduce gain based on time at high gain rather than proximity to the second frequency.

Repeated re-programming of the PLLs consumes valuable processor time in current techniques.

SUMMARY OF INVENTION

According to one aspect of the invention there is provided a phase locked loop, PLL, that sets gain automatically. The PLL comprising a frequency discriminator for providing a first signal that represents the difference between a first frequency and a second frequency. The PLL also comprising a comparator coupled to the frequency discriminator for receiving the first signal and providing a second signal based on information from the first signal. The second signal is representative of a gain setting for the phase locked loop to set.

According to another aspect of the invention there is provided a method for automatically setting gain in a phase locked loop, PLL, in which the PLL comprises a phase detector. The method comprising initiating a frequency change in the operation of the PLL from a first frequency to a second frequency, increasing gain of the phase detector at the beginning of the frequency change, and decreasing gain of the phase detector based on a predetermined characteristic of the operation of the PLL during the frequency change.

The above and further features of the invention are set forth with particularity in the appended claims and together with advantages thereof will become clearer from consideration of the following detailed description of an exemplary embodiment of the invention given with reference to the accompanying drawings.

DETAILED DESCRIPTION

Figure 1:
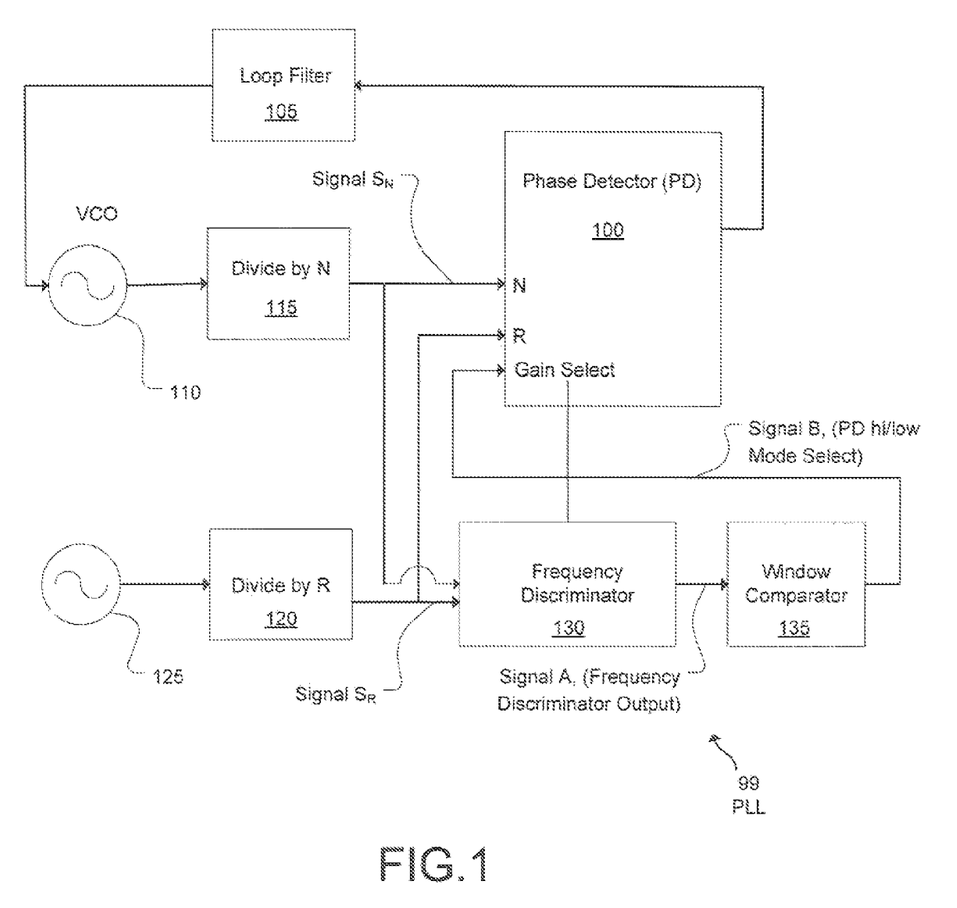
FIG. 1 is a block diagram of a phase locked loop that sets gain independently.

Turning now to FIG. 1 of the accompanying drawings there is shown a phase-locked loop (herein after referred to as a PLL) 99, in which high gain and low gain are set automatically. That is to say the gains of the PLL are set without intervention by an external controller such as a mobile phone system processor. For simplicity of description, two gain settings are discussed, low gain and high gain. It will be appreciated by those possessed of the appropriate skills that multiple gain settings can be used.

A voltage controlled oscillator (herein after referred to as a VCO) 110 drives a programmable divide-by-N counter 115, to provide a signal SN at the output of the counter 115. Reference oscillator 125 drives a programmable divide-by-R counter 120, to provide signal SR at the output of counter 120. A frequency discriminator 130, receives and uses signal SN and signal SR to provide a signal A to window comparator 135. The signal A is representative of the difference between the two input signals, signal SN and signal SR. The window comparator 135 receives the signal A and applies a function thereto, which causes signal B to be generated and provided to a to a phase detector 100. The phase detector 100 receives the signal SN and the signal SR, and provides feedback through a loop filter 105 to the VCO 110. The phase detector 100 also receives signal B and uses signal B to determine the appropriate phase detector gain settings.

Figure 2:
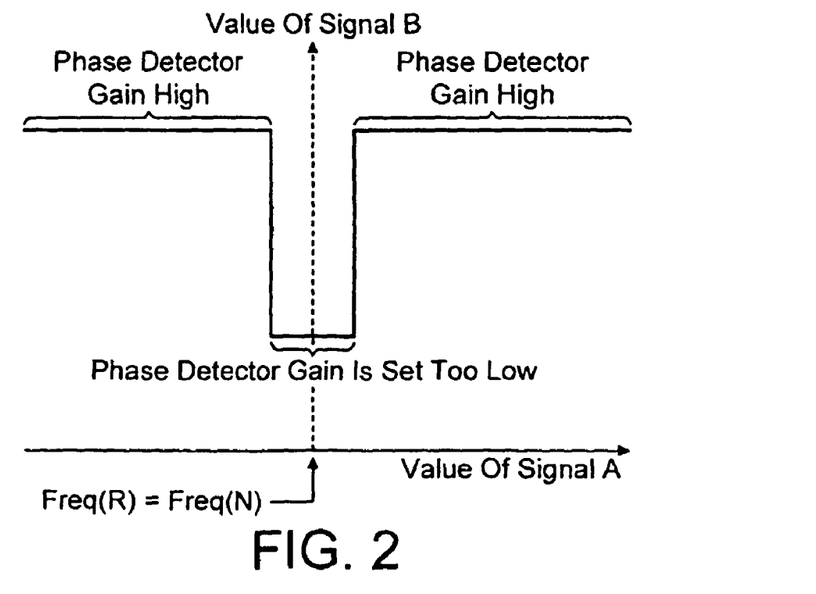
FIG. 2 is a graphical representation of the functional relationship between input signal A and output signal B for a window comparator.

In FIG. 2 or the accompanying drawings there is shown a graphical representation of the function of signal B in relation to signal A. In this example, when the difference between signal SN and signal SR (represented by signal A) is close to zero, signal B is low. When the difference (represented by signal A) is above a preset level (positive or negative), signal B is high. Phase detector 100 uses the high or low signal to set gains high or low respectively. In this way, the phase detector 100 gain stays set low for small frequency changes and is only switched to high for larger frequency changes.

It will be appreciated by those possessed of the appropriate skills that the transition between low and high gain does not have to be a square function as depicted in FIG. 2. Smoother transitions using multiple different gains can be used as design requirements dictate.

Loop gain is set by adjusting the gain of the phase detector 100. It will also be appreciated that loop gain can be adjusted in other ways. For example, adjusting the gain of VCO 110 or loop filter 105 could also be used to adjust the overall phase locked loop gain.

Figure 3:
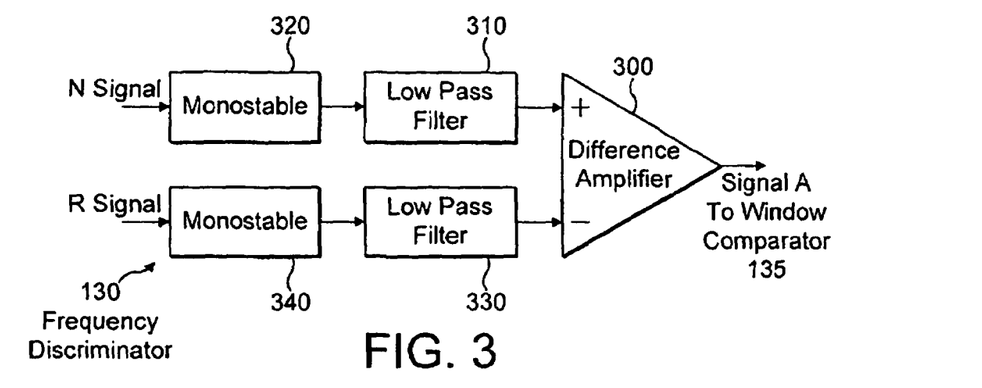
FIG. 3 is an implementation of a frequency discriminator of the phase locked loop of FIG. 1.

Turning now to FIG. 3 there is shown in more detail an implementation of the frequency discriminator 130. A first monostable 320 has an input coupled to receive signal SN from the counter 115 and an output coupled to a first low pass filter 310. A second monostable 340 has an input coupled to receive signal SR from the counter 120 and an output coupled to a second low pass filter 330. The first and second low pass filters 310 and 330 have outputs coupled to a difference amplifier 300 which in turn has an output coupled to provide a signal to the window comparator 135 (see FIG. 1).

Each combination of monostable (320, 340) and low pass filter (310, 330) provides a signal with a DC level that is linearly proportional to the frequency of the signal at the monostable input. The difference amplifier 300 receives the signals from the low pass filters (320, 330), compares the two signals and provides to the window comparator 135 a signal A that is proportional to the difference in the frequencies of the signals SN and SR.

Figure 4:
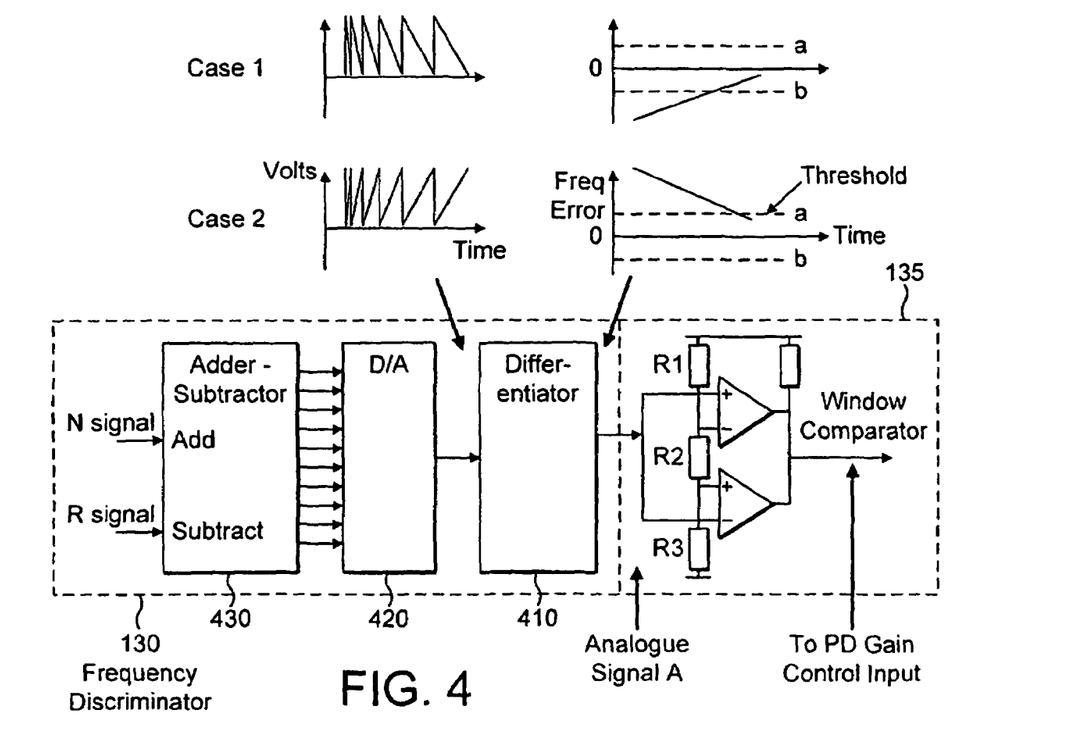
FIG. 4 is an alternate implementation of a frequency discriminator and a window comparator.

An alternative implementation of frequency discriminator 130 and window comparator 135 is shown in more detail in FIG. 4. A digital adder-subtractor 430 receives signal SN and signal SR. The output of the adder-subtractor 430 operates so that each pulse from signal SN increments the output by one and each pulse from signal SR decrements the output by one. Thus, when the frequencies of signal SN and SR are equal (or the frequency difference is zero) the output of the adder-subtractor stabilizes at a value. In practice, a reset feature could be used to force the stabilized value to be equal to zero.

The output from the adder-subtractor 430 is provided to a digital to analog converter DAC 420. The output of the DAC 420 is provided to a differentiator 410 through a low-pass filter (not shown), with which differentiator 410 provides an output to the window comparator 135. The differentiator 410 output is linearly proportional to the frequency difference between signal SN and signal SR.

Looking more closely at the output of the differentiator 410 as is provided to the window comparator 135, the operation of the window comparator 135 depends on the voltage of the signal from the differentiator 410. If the signal from the differentiator 410 is above a preset threshold in relation to zero or below a preset threshold in relation to zero then the output of the window comparator 135 is high. If the signal from the differentiator 410 is smaller than a preset value then the output of the window comparator 135 is low. The output of the window comparator 135 is received by the phase detector 100 and causes the gain of the phase detector 100 to be set to a high or a low value depending on whether the window comparator signal is high or low respectively. In the circuit shown in FIG. 4 the thresholds are determined by the values of resistors R1, R2 and R3.

Further shown in FIG. 4 are case 1 and case 2, which are graphical representations of the relationship between signal A output by the differentiator 410 and the input to the differentiator 410. In case 1 and 2, when the saw tooth gradient is decreasing with time the difference in frequency is reducing. In the region above (a) or below (b) the window comparator 135 sets signal B to high. In the region bracketed by (a) and (b) around the zero frequency error line, the window comparator 135 sets signal B to low. The phase detector 100 reacts by setting phase detector gain to low or high based on signal B respectively being low or high.

An alternative implementation for selecting low gain at the near completion of a frequency change is to select low gain once the frequency error changes sign. This would occur when the frequency error (difference between the desired frequency and the present frequency, represented by case 1 or case 2) value crosses the frequency error equals zero line. Until the zero error line is crossed the PLL would maintain high gain.

Another alternative implementation is for low gain to be selected based on the rate of change of the frequency error. As the desired frequency is approached, the rate of change at which phase detector 100 is changing will be reducing in relation to the proximity to the desired frequency. Once a predetermined rate of change is reached low gain is signalled to the phase detector. The phase detector responds by selecting low gain.

Figure 5:
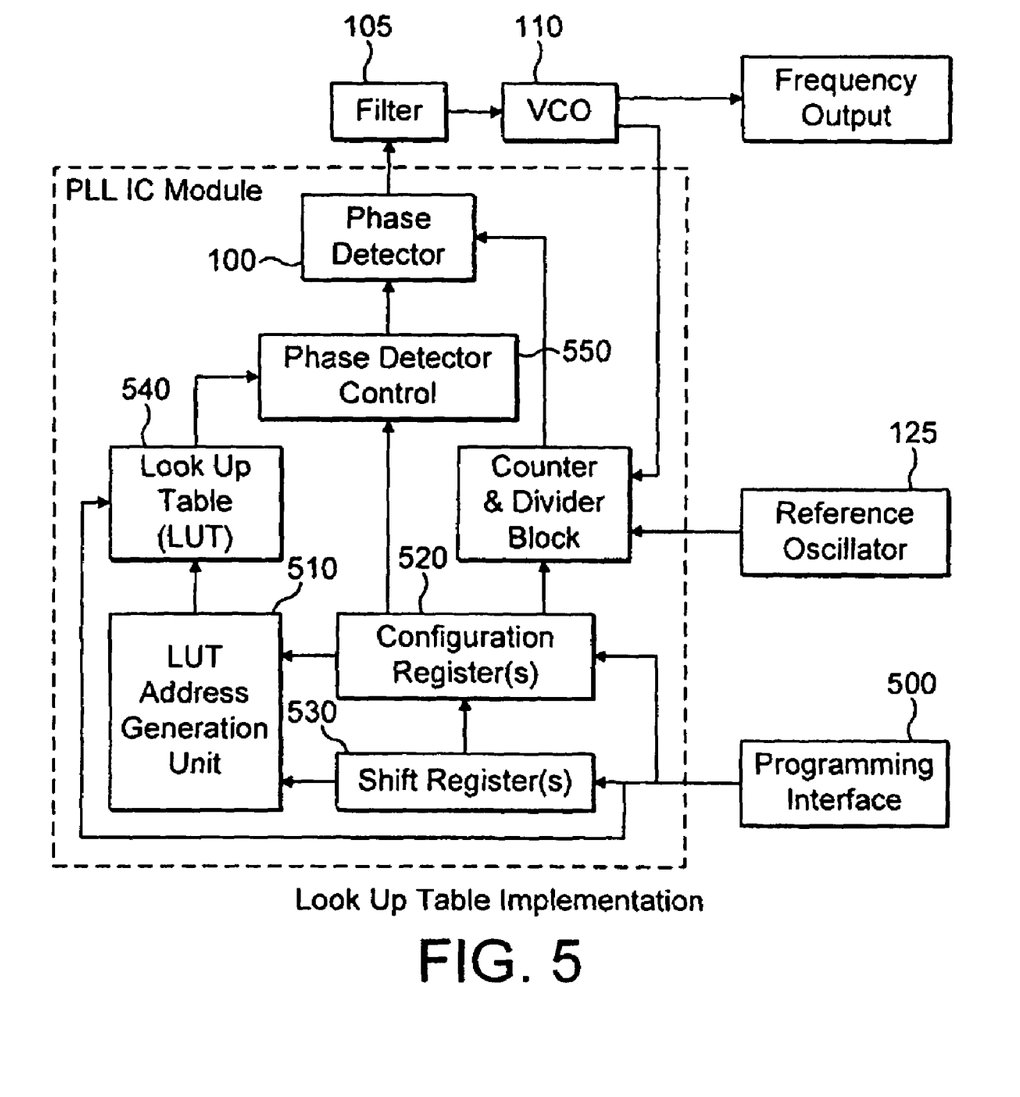
FIG. 5 is a block diagram of an implementation of a look up table which contains time value information used to determine the duration of high gain for a PLL during a frequency change.

Turning to FIG. 5 there is shown a block diagram of a PLL in which a look up table (LUT) 540 is used to determine the duration of the high gain setting for the PLL to use during a frequency change. The values stored in the LUT are the time values for which the PLL maintains high gain. Once high gain is set for a frequency change the PLL will return to low gain automatically based on time at high gain.

The programming interface 500 initialises the LUT 540. If the LUT is read only memory (ROM) based then this operation is not applicable. The programming interface 500 is also used to program the registers 520 and 530.

The LUT address generation unit 510 compares the current active configuration of the PLL stored in the configuration register(s) 520, to the new configuration stored in the shift register(s) 530 and outputs an address to the LUT 540. At this address in the LUT 540 is a time value which represents the length of time over which the PLL applies high gain during a frequency change. The time value from the LUT 540 is provided to the phase detector control 550.

The phase detector control 550 provides the PLL with the time value over which the PLL applies high gain during a frequency change along with an indication that high gain be selected for the phase detector 100.

In this way the system processor is used to initially program the PLL to high gain for a frequency change but the processor is not used for the follow-on reduction in gain when the PLL nears the desired frequency. Once the appropriate time has gone by, the PLL returns to low gain automatically.

Look up tables (LUTs) tend to be expensive in terms of chip space and it is therefore desirable to use small LUTs where possible. However, system requirements often dictate the use of a large LUT.

For example, in wireless communication, primary Global System for Communication, GSM, has 124 discrete radio frequency channels. A LUT that provides a direct mapping from any channel to any other channel would be a 124×124 element matrix. Memory requirements and hardware requirements to hold the data for a LUT matrix of this size is large.

In order to reduce the size of the LUT for the PLL of FIG. 5, entries are grouped together and averaged to produce a single entry that will serve multiple channel changes.

In GSM the LUT size is reduced to a 31×31 element matrix by grouping sets of 4 elements together and averaging them. Significantly less memory is required to store the elements of the reduced matrix due to the significantly fewer number of elements. Each entry represents the time duration at high gain for the PLL to maintain for a frequency change. Each high gain duration value applies to four GSM channels. The averaging of the matrix elements sacrifices some degree of accuracy and performance but is more manageable from a memory size stand point.

In operation, starting channel (Cs) which is one of the 124 available GSM channels, is divided by 4 to identify its starting channel group (Gs). The starting channel group is representative of one of the elements of the reduced 31×31 element matrix. The destination channel (Cd) is also divided by 4 to identify it's destination channel group (Gd). In this way the PLL uses the high gain duration stored in LUT element (Gs, Gd) when changing from starting channel Cs to destination channel Cd.

In expressive form:

Gs=Cs divided by 4

Gd=Cd divided by 4

High Gain Duration=LUT (Gs, Gd)

A more specific example of the implementation is the PLL has a requirement to transition from channel 120 to channel 45. The starting channel group: Gs=120/4=30. Thus starting channel, Cs=120, is a member of starting channel group 30 of the reduced matrix. The destination channel group: Gd=45/4=11.25. In this situation all fractions are rounded up to the nearest whole number and thus the destination channel, Cd=45 is a member of the destination channel group 12.

Further reductions in the size of the LUT are achieved when the high gain duration required to go from Cs to Cd is the same as when going from Cd to Cs. In operation, only one set of values is used. The elements of the matrix that are duplicates are not required to be stored in memory.

Additional hardware size reductions might suggest that the LUT be read only memory (ROM) based. This requires less hardware than a comparative random access memory (RAM). Significant circuit changes however impose the added requirement of re-fabricating the ROM contents each time there is a change.

To maximize a LUT performance, the circuit that is associated with the LUT should be fully characterized. For a circuit to be fully characterized, the circuit is built and evaluated as to the circuit's actual operating characteristics. The operating characteristics are specific to the hardware and the construction methods used to build the circuit. The circuit's actual operating characteristics are used to develop accurate information for the elements of the LUT. Significant circuit alterations would however necessitate re-evaluation of the information for the LUT elements.

It will be appreciated by those possessed of appropriate skill that the approach of using a LUT to set PLL gains would be well suited for applications where reducing processor involvement with PLL gain settings is of high priority in relation to memory or hardware size requirements.

Having thus described the invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

The invention claimed is:

1. A phase locked loop (PLL) that sets gain automatically, the PLL comprising:
   a frequency discriminator for providing a first signal that represents the difference between a first frequency and a second frequency; and
   a comparator coupled to the frequency discriminator for:
      receiving the first signal, and
      providing a second signal based on information from the first signal, the second signal being representative of a gain setting for the phase locked loop to set;
   wherein the frequency discriminator comprises:
      a first monostable coupled to a first low pass filter, the first monostable and first filter together receiving the first frequency and providing a first output;
      a second monostable coupled to a second low pass filter the second monostable and second filter together receiving the second frequency and providing a second output; and
      a difference amplifier coupled to the first and second monostable and filter combinations for:
         receiving the first output and the second output;
         comparing the first output to the second output; and
         providing the first signal to the comparator which is representative of the difference between the first output and the second output.

2. A phase locked loop (PLL) that sets gain automatically, the PLL comprising:
   a frequency discriminator for providing a first signal that represents the difference between a first frequency and a second frequency; and
   a comparator coupled to the frequency discriminator for:
      receiving the first signal, and
      providing a second signal based on information from the first signal, the second signal being representative of a gain setting for the phase locked loop to set;
   wherein the frequency discriminator comprises:
      an adder-subtractor for receiving the first frequency and the second frequency and for providing a digital signal;
      a digital to analog converter coupled to the adder-subtractor for converting the digital signal to an analog signal; and
      a differentiator coupled to the digital to analog converter for receiving the analog signal and for providing the first signal to the comparator which is representative of the difference between the first frequency and the second frequency.

3. A method for automatically setting gain in a phase locked loop (PLL) in which the PLL comprises a phase detector, the method comprising:
  initiating a frequency change in the operation of the PLL from a first frequency to a second frequency;
  increasing gain of the phase detector at the beginning of the frequency change;
  determining a difference between the first frequency and the second frequency, wherein determining the difference between the first frequency and the second frequency comprises:
    inputting a first signal operating at the first frequency to a first monostable coupled to a first low pass filter to obtain a first output;
    inputting a second signal operating at the second frequency to a second monostable coupled to a second low pass filter to obtain a second output;
    inputting the first output and the second output to a difference amplifier;
    comparing the first output to the second output to determine the difference between the first frequency and the second frequency; and
    generating a difference signal representative of the difference between the first frequency and the second frequency; and
  decreasing gain of the phase detector based on a characteristic of the difference signal.

4. A method of operating a phase locked loop (PLL), comprising:
  initiating a frequency change in operation of the PLL;
  increasing gain of phase detector of the PLL at the beginning of the frequency change; and
  decreasing gain of the phase detector after a predetermined time duration following the beginning of the frequency change,
  wherein the predetermined time duration is determined by
    comparing a current active configuration of the PLL stored in a configuration register to a new configuration store in a shift register and outputting an address, and
    using the address to access a lookup table stored in memory to obtain the predetermined time value.

5. The method of claim 3, wherein the characteristic of the difference signal is a magnitude of the difference between the first frequency and the second frequency.

6. The method of claim 5, wherein the magnitude is zero.

7. The method of claim 3, wherein the characteristic of the difference signal is a rate of change of the difference between the first frequency and the second frequency.

8. A circuit comprising:
  means for initiating a frequency change in the operation of phase locked loop (PLL) from a first frequency to a second frequency;
  means for increasing gain of the phase detector at the beginning of the frequency change;
  means for determining a difference between the first frequency and the second frequency, wherein said means determining the difference between the first frequency and the second frequency further comprises:
    means for inputting a first signal operating at the first frequency to a first monostable coupled to a first low pass filter to obtain a first output;
    means for inputting a second signal operating at the second frequency to a second monostable coupled to a second low pass filter to obtain a second output;
    means for inputting the first output and the second output to a difference amplifier;
    means for comparing the first output to the second output to determine the difference between the first frequency and the second frequency; and
    means for generating a difference signal representative of the difference between the first frequency and the second frequency; and
  means for decreasing gain of the phase detector based on a characteristic of the difference signal.

9. A phone comprising a phase locked loop (PLL) comprising:
  a frequency discriminator for providing a first signal that represents the difference between a first frequency and a second frequency; and
  a comparator coupled to the frequency discriminator for:
    receiving the first signal, and
    providing a second signal based on information from the first signal, the second signal being representative of a gain setting for the phase locked loop to set;
  wherein the frequency discriminator comprises:
    a first monostable coupled to a first low pass filter, the first monostable and first filter together receiving the first frequency and providing a first output;
    a second monostable coupled to a second low pass filter the second monostable and second filter together receiving the second frequency and providing a second output; and
    a difference amplifier coupled to the first and second monostable and filter combinations for:
      receiving the first output and the second output;
      comparing the first output to the second output; and
      providing the first signal to the comparator which is representative of the difference between the first output and the second output.

10. The phone of claim 9, operable in accordance with the GSM standard.

11. A phone comprising:
  means for initiating a frequency change in the operation of phase locked loop (PLL) from a first frequency to a second frequency;
  means for increasing gain of the phase detector at the beginning of the frequency change;
  means for determining a difference between the first frequency and the second frequency, wherein said means for determining the difference between the first frequency and the second frequency further comprises:
    means for inputting a first signal operating at the first frequency to a first monostable coupled to a first low pass filter to obtain a first output;
    means for inputting a second signal operating at the second frequency to a second monostable coupled to a second low pass filter to obtain a second output;
    means for inputting the first output and the second output to a difference amplifier;
    means for comparing the first output to the second output to determine the difference between the first frequency and the second frequency and
    means for generating a difference signal representative of the difference between the first frequency and the second frequency; and
  means for decreasing gain of the phase detector based on a characteristic of the difference signal.

12. A method for automatically setting gain in a phase locked loop (PLL) in which the PLL comprises a phase detector, the method comprising:
  initiating a frequency change in the operation of the PLL from a first frequency to a second frequency;

increasing gain of the phase detector at the beginning of the frequency change;
determining a difference between the first frequency and the second frequency, wherein determining the difference between the first frequency and the second frequency comprises:
inputting a first signal operating at the first frequency and a second signal operating at a second frequency to an adder-subtractor to produce a digital signal;
converting the digital signal to an analog signal;
inputting the analog signal to a differentiator to produce a difference signal representative of the difference between the first frequency and the second frequency; and
decreasing gain of the phase detector based on a characteristic of the difference signal.

13. The method of claim 12, wherein the characteristic of the difference signal is a magnitude of the difference between the first frequency and the second frequency.

14. The method of claim 13, wherein the magnitude is zero.

15. The method of claim 12, wherein the characteristic of the difference signal is a rate of change of the difference between the first frequency and the second frequency.

16. A circuit comprising:
means for initiating a frequency change in the operation of a phase locked loop (PLL) from a first frequency to a second frequency;
means for increasing gain of the phase detector at the beginning of the frequency change;
means for determining a difference between the first frequency and the second frequency, wherein said means for determining the difference between the first frequency and the second frequency further comprises:
means for inputting a first signal operating at the first frequency and a second signal operating at a second frequency to an adder-subtractor to produce a digital signal;
means for converting the digital signal to an analog signal;
means for inputting the analog signal to a differentiator means to produce a difference signal representative of the difference between the first frequency and the second frequency; and
means for decreasing gain of the phase detector based on a characteristic of the difference signal.

17. A phone, comprising a phase locked loop (PLL) comprising:
a frequency discriminator for providing a first signal that represents the difference between a first frequency and a second frequency; and
a comparator coupled to the frequency discriminator for:
receiving the first signal, and
providing a second signal based on information from the first signal, the second signal being representative of a gain setting for the phase locked loop to set;
wherein the frequency discriminator comprises:
an adder-subtractor for receiving the first frequency and the second frequency and for providing a digital signal;
a digital to analog converter coupled to the adder-subtractor for converting the digital signal to an analog signal; and
a differentiator coupled to the digital to analog converter for receiving the analog signal and for providing the first signal to the comparator which is representative of the difference between the first frequency and the second frequency.

18. The phone of claim 17, operable in accordance with the GSM standard.

19. A phase locked loop (PLL) that sets gain automatically, the PLL comprising:
means for initiating a frequency change in operation of the PLL;
means for increasing gain of phase detector of the PLL at the beginning of the frequency change;
means for comparing a current active configuration of the PLL stored in a configuration register to a new configuration store in a shift register and outputting an address, and
means for using the address to access a lookup table stored in memory to obtain a predetermined time value;
means for decreasing gain of the phase detector after the predetermined time duration following the beginning of the frequency change.

20. A phone, comprising a phase locked loop (PLL) comprising:
means for initiating a frequency change in operation of the PLL;
means for increasing gain of phase detector of the PLL at the beginning of the frequency change;
means for comparing a current active configuration of the PLL stored in a configuration register to a new configuration store in a shift register and outputting an address, and
means for using the address to access a lookup table stored in memory to obtain a predetermined time value;
means for decreasing gain of the phase detector after the predetermined time duration following the beginning of the frequency change.

21. The phone of claim 20, operable in accordance with the GSM standard.

* * * * *